(12) United States Patent
El Sabahy et al.

(10) Patent No.: US 12,336,293 B2
(45) Date of Patent: Jun. 17, 2025

(54) SEMICONDUCTOR STRUCTURE WITH SELECTIVE BOTTOM TERMINAL CONTACTING

(71) Applicant: Murata Manufacturing Co., Ltd., Nagaokakyo (JP)

(72) Inventors: Julien El Sabahy, Grenoble (FR); Larry Buffle, Grenoble (FR); Stéphane Bouvier, Cairon (FR); Frédéric Voiron, Barraux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 208 days.

(21) Appl. No.: 18/087,892

(22) Filed: Dec. 23, 2022

(65) Prior Publication Data

US 2023/0125974 A1    Apr. 27, 2023

Related U.S. Application Data

(63) Continuation of application No. PCT/IB2021/055489, filed on Jun. 22, 2021.

(30) Foreign Application Priority Data

Jun. 25, 2020   (EP) .................................. 20305700

(51) Int. Cl.
*H01L 27/01*  (2006.01)
*H01L 21/70*  (2006.01)
(Continued)

(52) U.S. Cl.
CPC .......... *H10D 86/85* (2025.01); *H01L 21/707* (2013.01); *H10D 1/042* (2025.01); *H10D 1/47* (2025.01); *H10D 1/716* (2025.01)

(58) Field of Classification Search
CPC ..... H01L 27/016; H01L 21/707; H01L 28/20; H01L 28/91; H10D 86/85
See application file for complete search history.

(56) References Cited

U.S. PATENT DOCUMENTS 10,497,582 B2   12/2019  Voiron et al.
11,393,801 B2 *  7/2022  Shin ....................... H01G 4/012
(Continued)

FOREIGN PATENT DOCUMENTS

EP   3567645 A1   5/2018
EP   3570307 A1  11/2019
(Continued)

OTHER PUBLICATIONS

International Search Report issued for PCT/IB2021/055489, date of mailing Aug. 25, 2021.
(Continued)

*Primary Examiner* — Ali Naraghi
(74) *Attorney, Agent, or Firm* — ArentFox Schiff LLP (57) ABSTRACT

A semi-conductor structure with selective bottom terminal contacting is described. The semiconductor device comprises a first metal layer disposed over a substrate; a conductive layer disposed over the first metal layer; and a second metal layer disposed over the conductive layer, the second metal layer embedding a porous structure comprising a plurality of pores that extend substantially perpendicularly from a top surface of the porous structure toward the conductive layer, wherein only a subset of the plurality of pores open onto the conductive layer.

14 Claims, 9 Drawing Sheets (51) Int. Cl.
    *H10D 1/00*        (2025.01)
    *H10D 1/47*        (2025.01)
    *H10D 1/68*        (2025.01)
    *H10D 86/85*     (2025.01)

(56) References Cited

U.S. PATENT DOCUMENTS

| | | | |
|---|---|---|---|
| 2006/0113578 A1* | 6/2006 | Chung | H10D 1/694 |
| | | | 257/303 |
| 2006/0138394 A1* | 6/2006 | Den | B81B 1/002 |
| | | | 438/409 |
| 2009/0034162 A1 | 2/2009 | Yawata et al. | |
| 2016/0268144 A1* | 9/2016 | Voiron | H01L 21/02258 |
| 2019/0096587 A1* | 3/2019 | Shin | H01G 4/306 |

FOREIGN PATENT DOCUMENTS

| | | | |
|---|---|---|---|
| EP | 3680934 A1 | 7/2020 | |
| WO | 2015063420 A1 | 5/2015 | |

OTHER PUBLICATIONS

Banerjee, P. et al.; "Nanotubular metal-insulator-metal capacitor arrays for energy storage"; Nature Nanotechnology, vol. 4, May 2009, pp. 292-296.

\* cited by examiner

SEMICONDUCTOR STRUCTURE WITH SELECTIVE BOTTOM TERMINAL CONTACTING

CROSS REFERENCE TO RELATED APPLICATIONS

The present application is a continuation of International application No. PCT/IB2021/055489, filed Jun. 22, 2021, which claims priority to European Patent Application No. 20305700.5, filed Jun. 25, 2020, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. ("Banerjee") describe a metal-insulator-metal (MIM) structure formed in a porous region, such as anodic aluminum oxide (AAO). Banerjee's AAO embedded structure however suffers from limited capacitance density due to the AAO thickness that can be deposited by Atomic Layer Deposition (ALD).

A structure by F. Voiron et al. ("Voiron") that improves Banerjee's capacitance is described in international application publication WO 2015/063420 A1. Voiron's structure results in a highly integrated capacitance that may be used in a variety of applications.

Generally, AAO embedded structures as described above result from embedding a structure (e.g., a metal-insulator-metal (MIM) stack) inside a porous region formed above a substrate, such as a silicon wafer.

Figure 1:
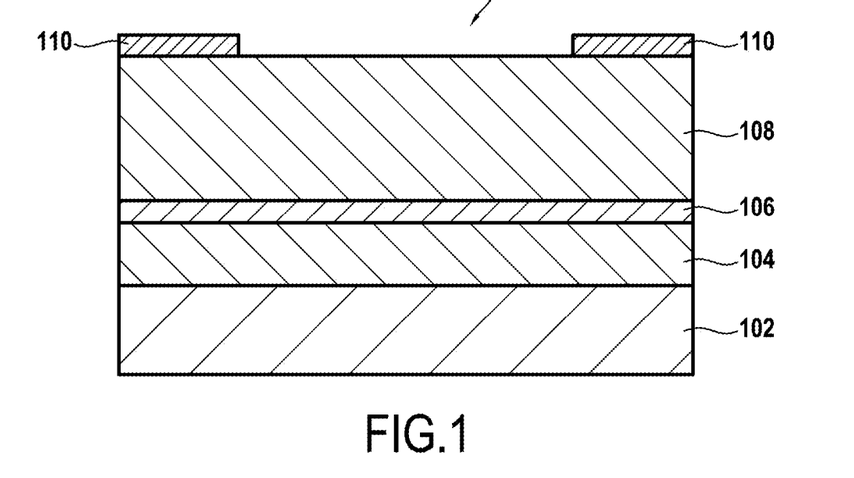
FIG. 1 is a cross-section view of an example stack 100 used in fabricating a product having an AAO porous region.

FIG. 1 is a cross-section view of an example stack 100 that may be used in fabricating a product having an AAO porous region. Example stack 100 may be used, for example, to fabricate an integrated capacitor structure as described by Voiron. Example structure 100 is provided for the purpose of illustration only and, as would be understood by a person skilled in the art, other stacks may also be used.

As shown in FIG. 1, stack 100 includes a substrate 102, a first metal layer 104, a conductive layer 106, a second metal layer 108, and a mask layer 110. The substrate 102 may be made, without limitation, of silicon, glass, or a polymer. The substrate 102 may be a raw (i.e., unprocessed) substrate or processed with other electronic components already formed thereon.

The first metal layer 104 may include one or more metal layers. The one or more metal layers may be made, without limitation, of aluminum (Al), copper (Cu), silver, and/or aluminum copper (AlCu). The one or more metal layers may be combined or not with barrier metals such as titanium (Ti), titanium nitride (TiN), tantalum (Ta), and tantalum nitride (TaN). In one implementation, the first metal layer 104 includes an AlCu layer sandwiched between two TiN or TiTiN layers. In an embodiment, the first metal layer 104 serves as the bottom terminal of the integrated capacitor structure that is formed within the AAO porous structure.

The conductive layer 106 may be made of any conductive material. In an embodiment, the conductive layer 106 is made of Tungsten. In an embodiment, as further described below, the conductive layer 106 is made from a material that allows the conductive layer 106 to serve as a barrier layer that protects the first metal layer 106 from anodization.

The second metal layer 108 may be made of aluminum, though other metals such as titanium or tungsten may also be used. In an embodiment, the metal used for the second metal layer 108 is selected as a metal that provides a well-organized porous structure when subject to anodization.

To obtain the AAO porous structure in which, for example, the MIM stack is embedded, the second metal layer 108 is subjected to an anodization process.

Typically, the AAO porous structure is formed only in a portion of the second metal layer 108. In an embodiment, as shown in FIG. 1, this is achieved by forming the mask layer 110, on top of the second metal layer 108, such that the mask layer 110 is open over a defined area of the second metal layer 108 (i.e., the area in which the AAO porous structure is desired to be formed).

The mask layer 110 may be a hard mask. The mask layer 110 may be made of silicon oxide or a metal, such as titanium or tantalum.

Next, the portion of the second metal layer 108 defined by the mask layer 110 is anodized to form the AAO porous structure within the second metal layer 108. An example AAO porous structure 112 that results from this process is shown in FIG. 2A, for the purpose of illustration.

In an embodiment, the anodization process includes multiple steps, including a first anodization step, an etching step, and a second anodization step. The first anodization step forms an anodic oxide layer having shallow pores on top of the second metal layer 108. The formed anodic oxide layer is then etched resulting in the top surface of second metal layer 108 developing a texture that defines the eventual pore locations. The second anodization step completes the anodization of second metal layer 108 to form the pores as shown in FIG. 2A.

Figure 2A:
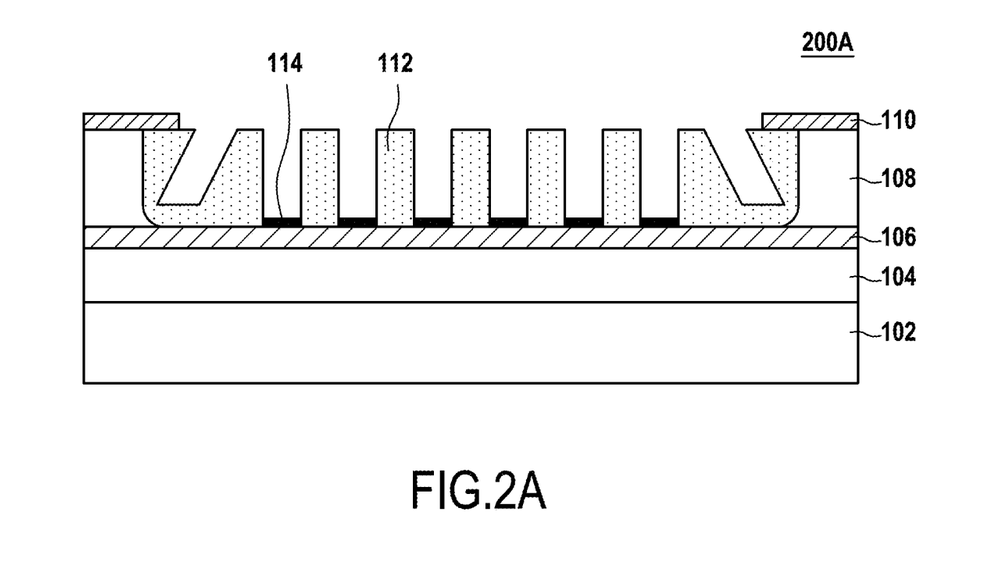
FIGS. 2A-2B illustrate steps of an example process for fabricating a capacitive component embedded in an AAO porous region.

As shown in FIG. 2A, the AAO porous structure 112 includes pores that extend from a top surface of the porous structure 112 toward the conductive layer 106. A plurality of these pores (non-lateral ones) extend perpendicularly or substantially perpendicularly toward the conductive layer 106. However, other pores, namely lateral pores that fall closer to the edges of the mask layer 110, tend to curve away from the perpendicular direction and into the sides of the embedding portion of the second metal layer 108. Generally, these lateral pores may have uneven depths and/or diameters. As such, according to the embodiments described herein, they are not used for receiving the MIM stack. Among other reasons, this is because their capacitive contributions cannot be precisely quantified. Hereinafter, the description will not be concerned with the lateral pores, and any mention to the pores of the porous structure 112 will be understood to refer only to the perpendicularly extending pores of the porous structure 112.

As mentioned above, in an embodiment, the conductive layer 106 is made from a material that allows the conductive layer 106 to serve as a barrier layer that protects the first metal layer 106 from the anodization process. Specifically, as the pores propagate down toward the conductive layer 106, the conductive layer 106 oxidizes where the pore mouths meet the conductive layer 106. The formed oxide of the conductive layer 106 creates oxide plugs 114, which as shown in FIG. 2A plug the pores and prevent them from further progressing into the conductive layer 106 and towards the first metal layer 106.

Figure 2B:
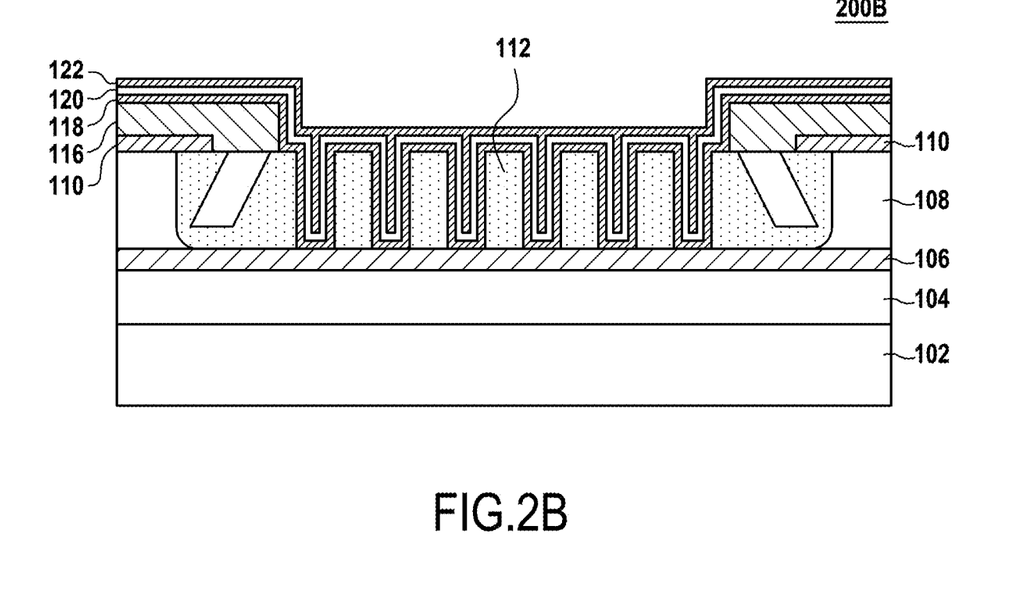

In the structure of Voiron described above, the oxide plugs 114 are fully etched away after the anodization step to fully open the pores onto the conductive layer 106. The MIM stack, consisting of a metal layer 118, an insulator layer 120, and a metal layer 122, is then deposited into the pores as shown in FIG. 2B. The successive layers of the MIM stack follow the contours of the porous structure 112 resulting in the MIM stack being embedded inside the pores of the porous structure 112. The fully open pores allow electrical contact between the metal layer 118 of the MIM stack and the conductive layer 106 across all of the pores of the porous structure 112.

This configuration allows Voiron's structure to have a very low Equivalent Series Resistance (ESR), which makes the structure highly suited for applications requiring, ideally, a purely capacitive component. For example, Voiron's structure may be very suitable for use in capacitive elements used for decoupling processors. In this context, capacitors are used as a local energy tank (and thus placed very close to the processor) to compensate voltage drops caused by the power supply line impedance in the case of a large current swing. In the event of a current swing, the capacitor acts to provide the charges (i.e., current) required by the processor for the duration of the current swing. As the current provided by the capacitor passes through the internal capacitor resistance of the capacitor, the ESR of the structure should be as low as possible to minimize the voltage drop across the capacitor.

However, a variety of other applications exist in which the capacitive component is required to exhibit a precise (non-zero) ESR value. This is the case, for example, for applications using what is known as an RC snubber. An RC snubber is a capacitor and a series resistor. An RC snubber is typically connected across a switch. The RC snubber protects the switch, particularly in a system with a high inductive load. Specifically, in such a system, when a sudden interruption of current occurs, a large voltage spike can form across the switch. Such a spike can be a source of electromagnetic interference (EMI) or even an overshoot beyond an acceptable voltage level, causing the switch or even the entire system to fail. The RC snubber provides an alternative path for high frequency spikes, draining current around the switch and providing a progressive discharge of the inductive path.

Furthermore, for certain applications, the ESR value of the capacitive component may be desired to be independent of the capacitance value of the capacitive component. For example, for applications such as distributed filters, delay lines, etc., there may be a need to have capacitive components of a given capacitance and an ESR tailored from a range of resistance values (e.g., from $0.1\Omega$ to $1.0\Omega$ (in $0.1\Omega$ increments) and from $1\Omega$ to $10\Omega$ (in $1\Omega$ increments)) independent of the capacitance. Existing AAO embedded structures and their fabrication processes, as summarized above, cannot satisfy this requirement because the ultimate ESR value of the capacitive element is directly proportional to the number of functional pores (i.e., pores receiving the MIM stack), or in other words the surface area, of the capacitive element.

In EP application no. 19 305 026.7, Bouvier et al. (Bouvier) proposes a resistor-capacitor (RC) architecture having a capacitive component embedded in a three-dimensional (3D) structure. Bouvier's RC architecture is illustrated by the structure 300 shown in FIG. 3. As shown, Bouvier's structure comprises a substrate 302 having formed therein a texture that provides a set of trenches or columns. The substrate 302 is a low ohmic substrate which provides the bottom electrode of the capacitive component of the structure 300.

Figure 3:
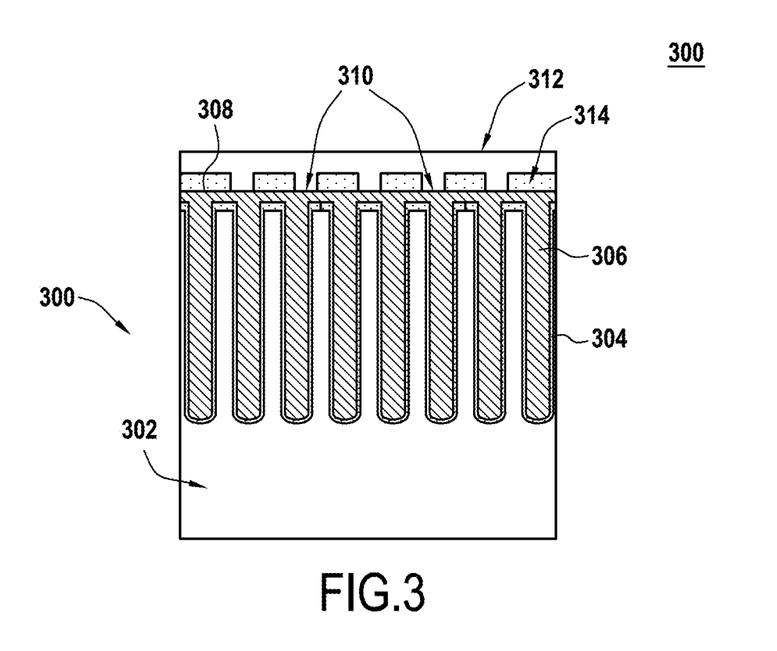
FIG. 3 illustrates a conventional resistor-capacitor (RC) architecture having a capacitive component embedded in a three-dimensional (3D) structure.

A continuous dielectric layer 304 is formed to line the texture of the substrate 302. The dielectric layer 304 constitutes the dielectric of the capacitive component. The top electrode of the capacitive component is formed by a conductive material 306 disposed on top of the dielectric layer 304 and along the contours of the substrate texture. The conductive material 306 forms a flat layer 308. The conductive material 306 is made of polysilicon.

A contact plate 312 is provided parallel to the layer 308 of the conductive material 306, separated by an insulating layer 314. The contact plate 312 may provide a top terminal of the RC circuit. The contact plate 312 may be made of aluminum.

The insulating layer 314 is opened to provide a set of bridging contacts 310 through the insulating layer 314. The bridging contacts 310 allow the layer 308 of the conductive material 306 to electrically contact the contact plate 312. The bridging contacts 310 may be a part of the contact plate 312.

In Bouvier's architecture, the resistance of the RC circuit can be varied by varying the number and/or widths of the bridging contacts 310. Specifically, the variation of resistance is made by possible by the use of polysilicon for the conductive material 306, a fairly resistive material (the sheet resistance of polysilicon is 10 ohm/square). This makes that a change in the number and/or widths of the bridging contacts 310 has a measurable impact on the resistance of the RC circuit.

However, Bouvier's solution has limitations for an AAO embedded RC circuit. This is because the thermal budget required for polysilicon deposition (>500° C.) exceeds largely the limit acceptable for AAO (<400° C.). This means that polysilicon may not be deposited inside an AAO structure without causing it to become ductile or melt.

One may, for example, instead of depositing the polysilicon inside the AAO structure, form a polysilicon layer on top of the top electrode (e.g., metal layer 122 in FIG. 2B) of the AAO embedded capacitive component, before contacting the top electrode through an insulating layer (like insulating layer 314) to a top terminal of the RC circuit. However, such a solution would significantly increase the profile the structure as two additional layers (polysilicon and insulating layers) would need to be added, particularly that polysilicon may not be formed in a thin layer without complicated processing steps.

SUMMARY OF THE INVENTION

The present invention proposes a method of fabricating an RC device, comprising:
  forming a first metal layer above a substrate;
  forming a conductive layer above the first metal layer;
  forming a second metal layer above the conductive layer;
  forming a first mask layer on top of the second metal layer, the first mask layer having an opening onto the second metal layer;
  anodizing the second metal layer to form a porous structure within the second metal layer, the porous structure underlying the opening of the first mask layer onto the second metal layer and comprising a plurality of pores that extend substantially perpendicularly from a top surface of the porous structure toward the conductive layer;

etching the bottom ends of a select set of pores of the plurality of pores; and forming a metal-insulator-metal (MIM) stack in the plurality of pores of the porous structure.

As the MIM stack is formed in the entirety of the plurality of pores of the porous structure, all of the plurality of pores contribute to the capacitance of the resulting RC device. In contrast, as only negligible resistivity is provided by the (bottom etched) select set of pores, the resistance of the resulting RC device is effectively provided by the pores whose bottom ends are left unopen, Thus, according to this fabrication method, the resistance of the resulting RC device is directly linked to the surface area of the select set of (bottom etched) pores. Thus, the method makes it possible to achieve a target resistance for the RC device simply by choosing the number/surface area of the select set of pores that are etched during the process.

Furthermore, as the MIM stack is formed in all of the plurality of pores of the porous structure, but only a select set of pores of the plurality of pores are open, the achieved resistance value can be decoupled (i.e., is independent) from the resulting capacitance of the RC device. Accordingly, RC devices of varying ranges of resistance values can be readily fabricated simply by varying the number of open pores during the fabrication process. Advantageously, these RC devices of varying resistance would also have substantially similar physical properties (e.g., same footprint, same thickness, and the same contact layout). This facilitates standardization in manufacturing, packaging, and integrating or mounting the resulting RC devices.

In an embodiment, the select set of pores correspond to a subset of the plurality of pores of the porous structure.

In an embodiment, etching the select set of pores opens the select set of pores onto the conductive layer.

In an embodiment, a bottom metal layer of the MIM stack contacts the conductive layer through the select set of pores.

In an embodiment, etching the select set of pores comprises exposing the porous structure to a wet etching solution. This is advantageous because wet processes involve low cost and a low thermal budget.

In an embodiment, prior to the etching, the bottom ends of the select set of pores are plugged up by an oxide (resulting from the anodization of the top surface) of the conductive layer, and exposing the porous structure to the wet etching solution dissolves said oxide.

In an embodiment, the method further comprises: forming a second mask layer over the porous structure, the second mask layer having an opening onto a second area of the porous structure.

In an embodiment, the select set of pores are comprised within the second area of the porous structure. In accordance with this embodiment, the method may further comprise: selecting a target resistance for the RC device; and determining a surface area of the second area of the porous structure as a function of the target resistance. Accordingly, the target resistance for the RC device can be achieved by mere selection of the surface area of the second area of the porous structure (or alternatively the size of the opening of the second mask layer).

In another embodiment, the method further comprises: forming an insulating layer on top of the conductive layer, the insulating layer having an opening onto a third area of the conductive layer.

In an embodiment, the select set of pores open onto the third area of the conductive layer through the opening of the insulating layer. In accordance with this embodiment, the method may further comprise: selecting a target resistance for the RC device; and determining a surface area of the third area of the conductive layer as a function of the target resistance. Accordingly, the target resistance for the RC device can be achieved by mere selection of the surface area of the third area of the conductive layer (or alternatively the size of the opening of the insulating layer).

In an embodiment, the insulating layer is formed and patterned over a planar layer (before the porous structure). As such, high photolithographic accuracy can be achieved when forming the insulating layer. As such, the use of the insulating layer increases control resolution over the surface area of the select set of pores, and by consequence over the achieved resistance.

Conversely, the present invention proposes semiconductor devices fabricated in accordance with the above described methods.

In an embodiment, a semiconductor device in accordance with the invention comprises:

a first metal layer disposed over a substrate;

a conductive layer disposed over the first metal layer; and a second metal layer disposed over the conductive layer, the second metal layer embedding a porous structure comprising a plurality of pores that extend substantially perpendicularly from a top surface of the porous structure toward the conductive layer, wherein only a subset of the plurality of pores open onto the conductive layer.

In another embodiment, a semiconductor device in accordance with the invention comprises:

a first metal layer disposed over a substrate;

a conductive layer disposed over the first metal layer;

an insulating layer disposed over the conductive layer, the insulating layer having an opening onto the conductive layer; and a second metal layer disposed over the insulating layer, the second metal layer embedding a porous structure comprising a plurality of pores that extend substantially perpendicularly from a top surface of the porous structure toward the conductive layer, wherein only a subset of the plurality of pores open onto the conductive layer via the opening of the insulating layer.

In an embodiment, the semiconductor device further comprises a metal-insulator-metal (MIM) stack formed in the plurality of pores of the porous structure. In an embodiment, a bottom metal layer of the MIM stack contacts the conductive layer through the subset of open pores.

As such, semiconductor devices according to the invention have a profile (thickness) that is substantially comparable to that of existing AAO embedded capacitive only devices.

In an embodiment, the insulating layer improves the electrical isolation between the bottom metal layer of the MIM stack and the first metal layer which serves as a bottom terminal of the device. This reduces uncontrolled leakage which can lower the resistance value of the device.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention provide semiconductor devices and methods for the fabrication thereof. The semiconductor devices may include an RC device having a capacitive component embedded in an AAO porous region. The RC device may be configured during fabrication to have a desired resistance value. The achieved resistance value can be decoupled (independent) from the resulting capacitance of the RC device.

As further described below, the resulting semiconductor devices have a profile (thickness) that is substantially comparable to that of existing AAO embedded capacitive only devices. Further, the fabrication methods only add very few customary process steps to the existing process.

FIGS. 4A-4H illustrate steps of an example process for fabricating an RC device having a capacitive component embedded in an AAO porous region according to an embodiment.

Figure 4A:
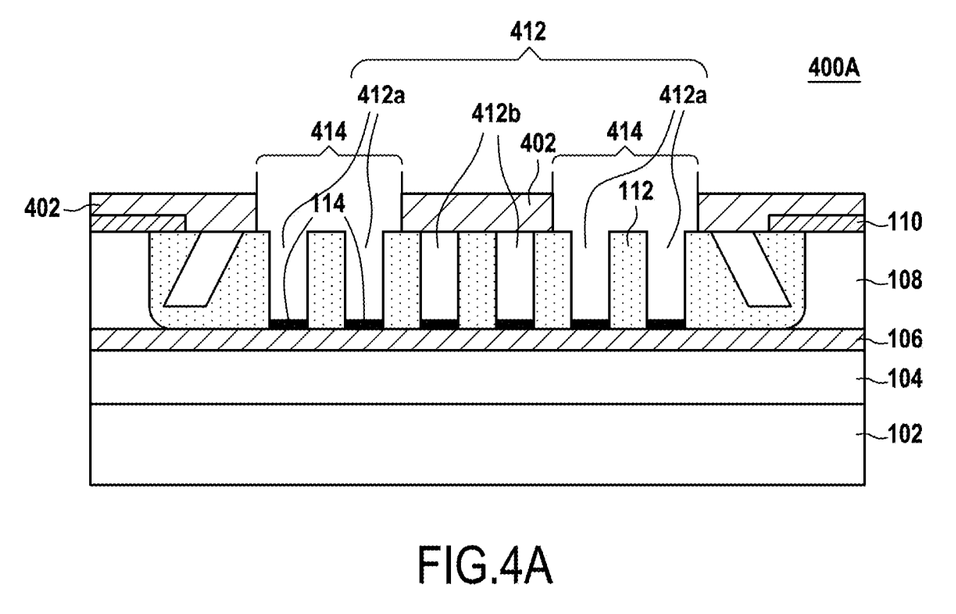
FIGS. 4A-4H illustrate steps of an example process for fabricating an RC device having a capacitive component embedded in an AAO porous region.

As shown in FIG. 4A, the process begins with a layer stack similar to the stack 100 described above with reference to FIG. 1. Particularly, the stack comprises a substrate 102, a first metal layer 104, a conductive layer 106, a second metal layer 108, and a mask layer 110.

The second metal layer 108 has been anodized as described above with reference to FIG. 2A to form therein the porous structure 112 having a plurality of pores 412. The plurality of pores 412 are plugged by oxide plugs 114 (oxide of the conductive layer 106) which prevent the pores from opening onto the conductive layer 106.

Next, a mask layer 402 is formed over the porous structure 112. The mask layer 402 may be made of silicon oxide for example, though other materials may also be used. The mask layer 402 is configured to have an opening onto (or above) an area 414 of the porous structure 112. As such, the mask layer 402 leaves open the top ends of a select set of pores 412a falling within the area 414 and blocks the top ends of the remaining set of pores 412b falling outside the area 414. As further discussed below, in an embodiment, the area 414, and more particularly its size (i.e., surface area), is chosen based on a desired resistance value of the RC device.

Figure 4B:
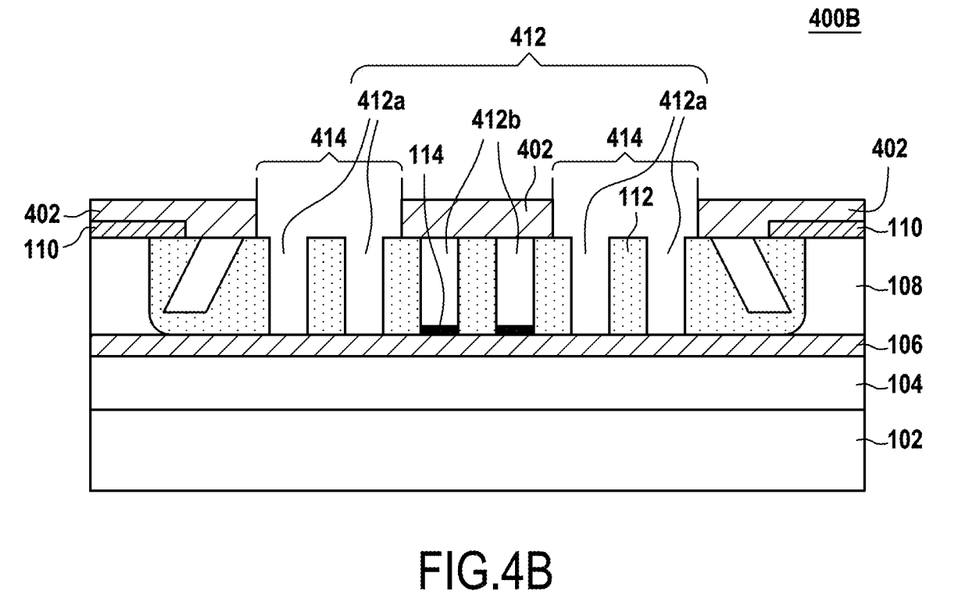

Subsequently, as shown in FIG. 4B, the porous structure 112 is exposed to a wet etching solution. The wet etching solution may be selected so as to dissolve an oxide of the conductive layer 106. For example, where the conductive layer 106 is made of Tungsten, the wet etching solution may be a buffer solution of potassium.

The exposure of the porous structure 112 to the wet etching solution causes the bottom ends of the select set of pores 412a (which fall within the area 414) to be etched away as shown in FIG. 4B. In contrast, protected by the mask layer 402, the bottom ends of the set of pores 412b remain filled by oxide plugs 114. The etching of the bottom ends of the select set of pores 412a opens the select set of pores 412a onto the conductive layer 106.

Figure 4C:
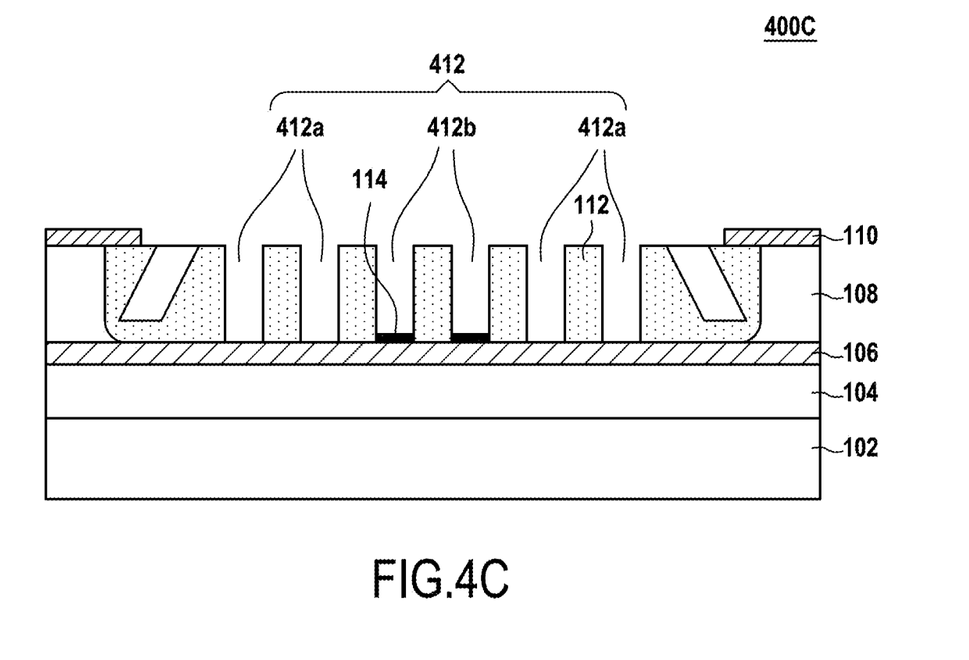

Next, as shown in FIG. 4C, the mask layer 402 is removed. The resulting structure 400C thus comprises a porous structure 112 having a plurality of pores 412 that extend substantially perpendicularly from a top surface of the porous structure 112 toward the conductive layer 106, and in which only the select set of pores 412a (i.e., a subset of pores) open onto the conductive layer 106.

Subsequently, the capacitive component may be embedded within the created porous structure 112.

Figure 4D:
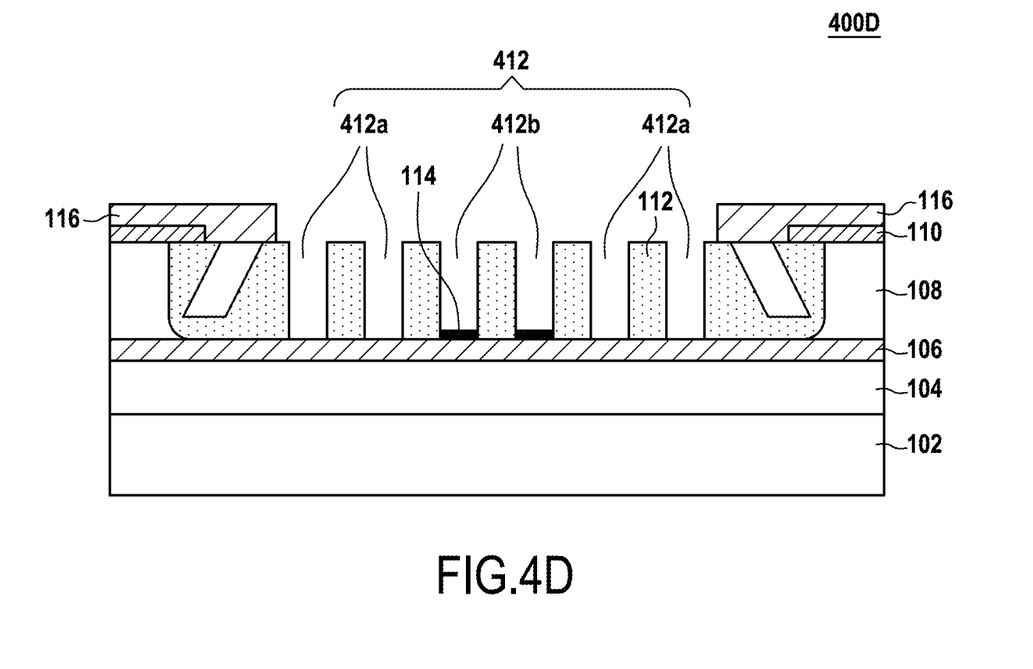

In an embodiment, as shown in FIG. 4D, a mask layer 116 may be formed over the porous structure 112 so as to cover the lateral pores of the structure 112. As mentioned above, the lateral pores consist of pores that fall closer to the edges of the mask layer 110 and which are not used for receiving the capacitive (e.g., MIM) component.

Figure 4E:
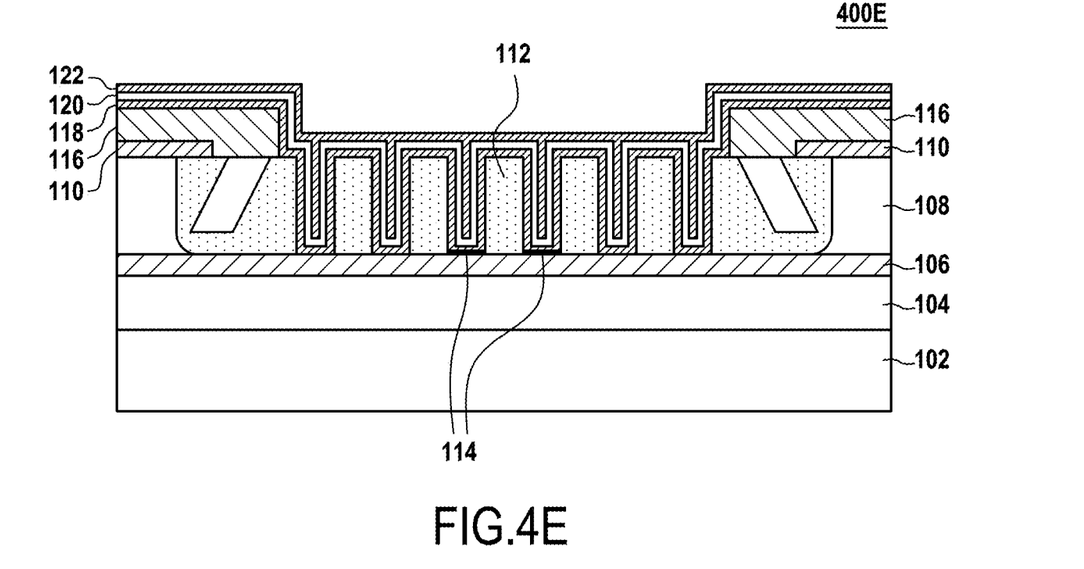

Next, as shown in FIG. 4E, a MIM stack, consisting of a metal layer 118, an insulator layer 120, and a metal layer 122, is formed in the plurality of pores 412 of the porous structure 112. However, while the MIM stack is formed in the plurality of pores 412, the bottom metal layer 118 of the MIM stack contacts the conductive layer 106 only through the select set of pores 412a of the plurality of pores 412.

As such, the resulting structure 400E provides an RC device. The plurality of pores 412, in their entirety, contribute toward the capacitance of the RC device. In contrast, only the pores 412b (of the plurality of pores 412) meaningfully contribute toward the resistance of the RC device.

In other words, the resistance of the RC device is a function of the size (surface area) of the area 414 of the porous structure 114 (or alternatively the size of the opening of the mask layer 402 onto the porous structure 112). More specifically, the larger the area 414 is (i.e., the greater the contact area between the metal layer 118 and the conductive layer 106), the lower is the resistance of the RC device. Conversely, the smaller the area 414 is (i.e., the smaller the contact area between the metal layer 118 and the conductive layer 106), the higher is the resistance of the RC device.

As such, in accordance with embodiments, the fabrication method may include the steps of selecting a target resistance for the RC device; and determining a surface area of the area 414 of the porous structure 112 as a function of the target resistance.

Accordingly, RC devices of varying ranges of resistance values can be readily fabricated simply by varying the size of the area 414 during the fabrication process. Advantageously, these RC devices of varying resistance would also have substantially similar physical properties (e.g., same footprint, same thickness, and the same contact layout). This facilitates standardization in manufacturing, packaging, and integrating or mounting the resulting RC devices.

Figure 4F:
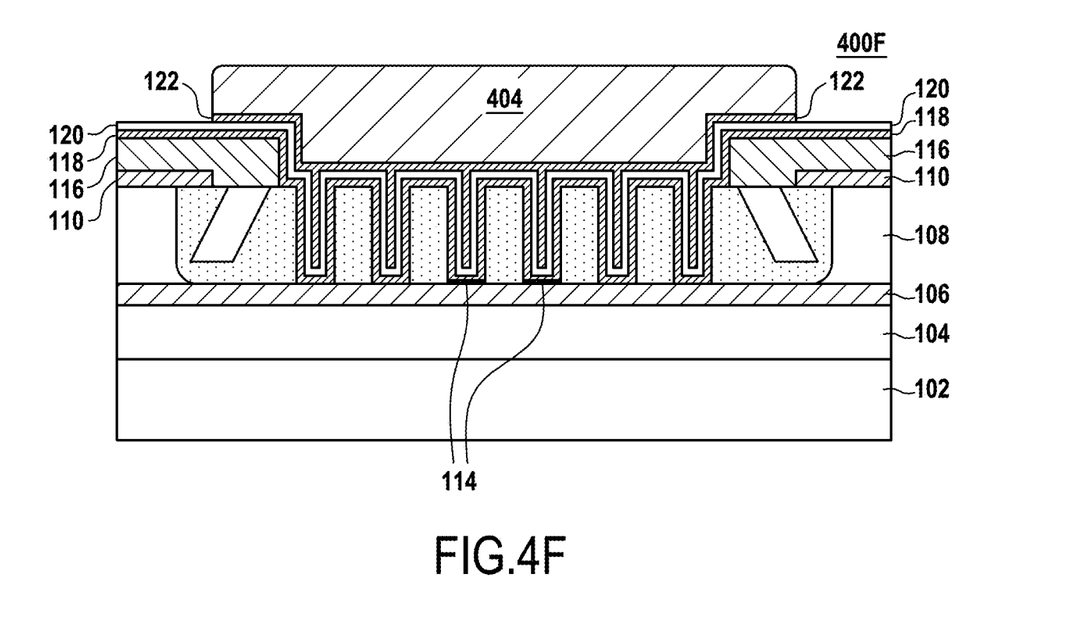

Referring now to FIG. 4F, the fabrication process may subsequently further include depositing and patterning a conductive layer (e.g., Aluminum) to form a top terminal 404 of the integrated RC device. The top terminal 404 contacts the top metal layer 122 of the MIM stack. In an embodiment, as shown in FIG. 4F, in forming the top terminal 404, the top metal layer 122 is removed in the areas where the top terminal 404 does not extend. In other words, the top metal layer 122 remains only underneath the top terminal 404. This reduces the possibility of a short leakage occurring between the top terminal 404 and the bottom terminal (i.e., metal layer 104).

Figure 4G:
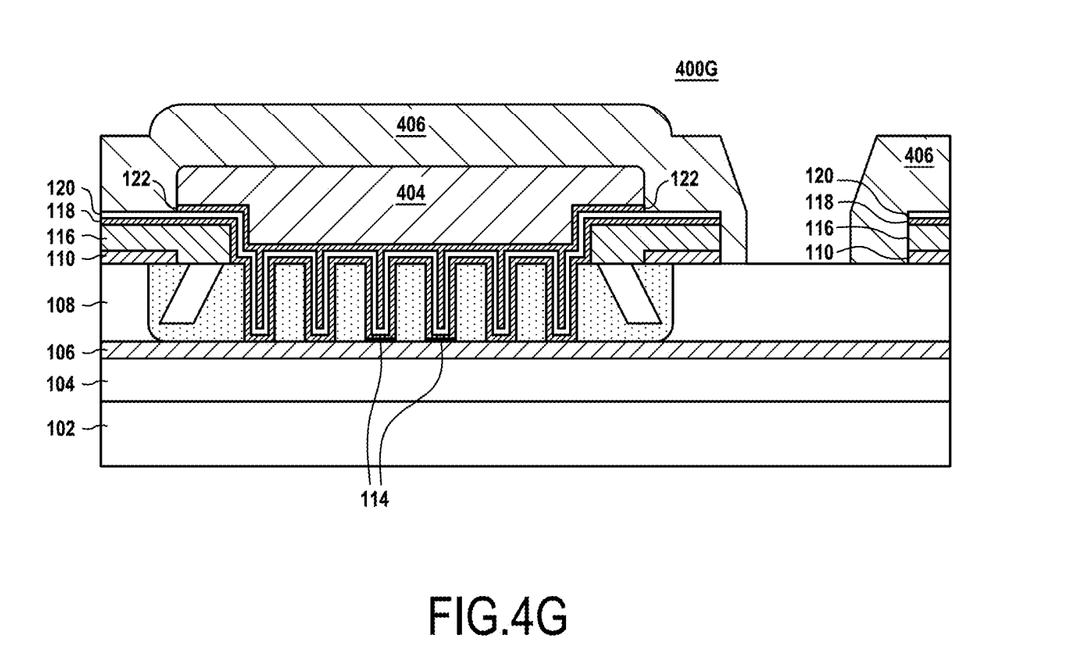

Next, as shown in FIG. 4G, an insulating material may be deposited and patterned to form an insulator layer 406.

Figure 4H:
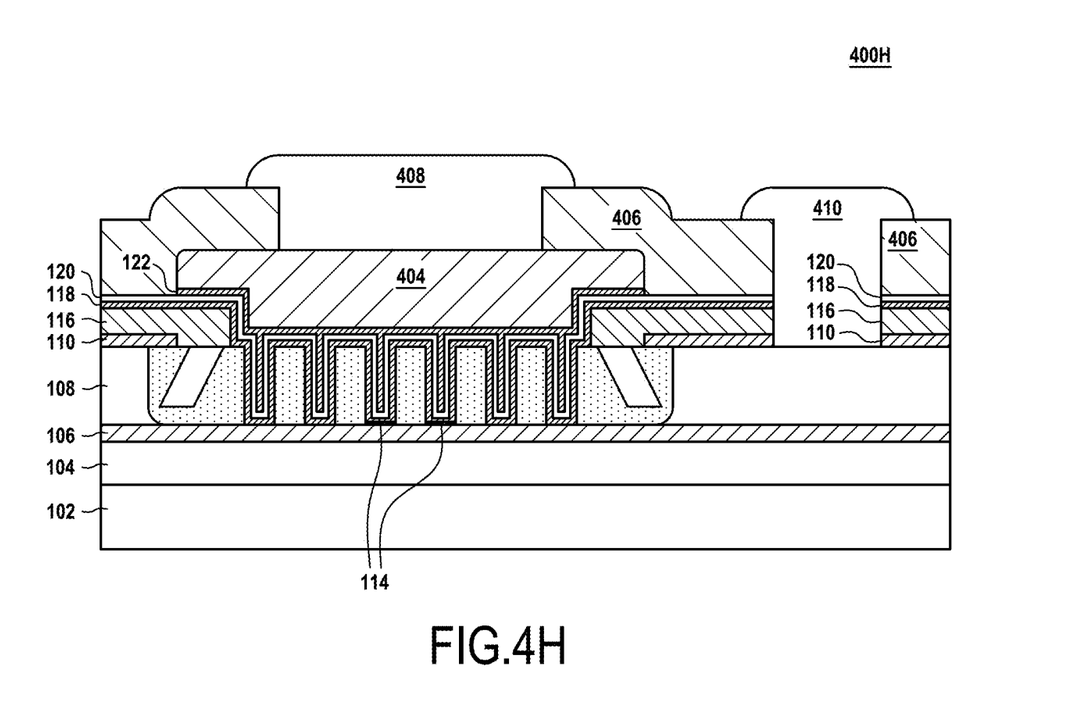

Finally, as shown in FIG. 4H, the insulator layer 406 is opened above the top terminal 404, and a conductive material (e.g., Aluminum) may be deposited and patterned. The conductive material provides a contact 408 for the top terminal 404 and a contact 410 for the bottom terminal (i.e., metal layer 104).

Figure 5A:
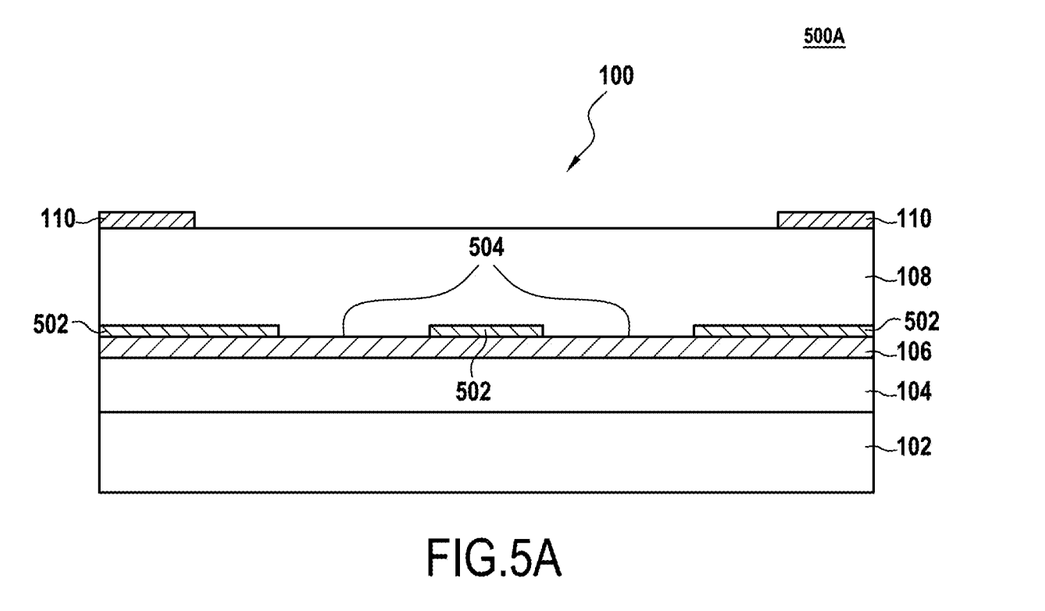
FIGS. 5A-5D illustrate steps of another example process for fabricating an RC device having a capacitive component embedded in an AAO porous region.
Figure 5B:
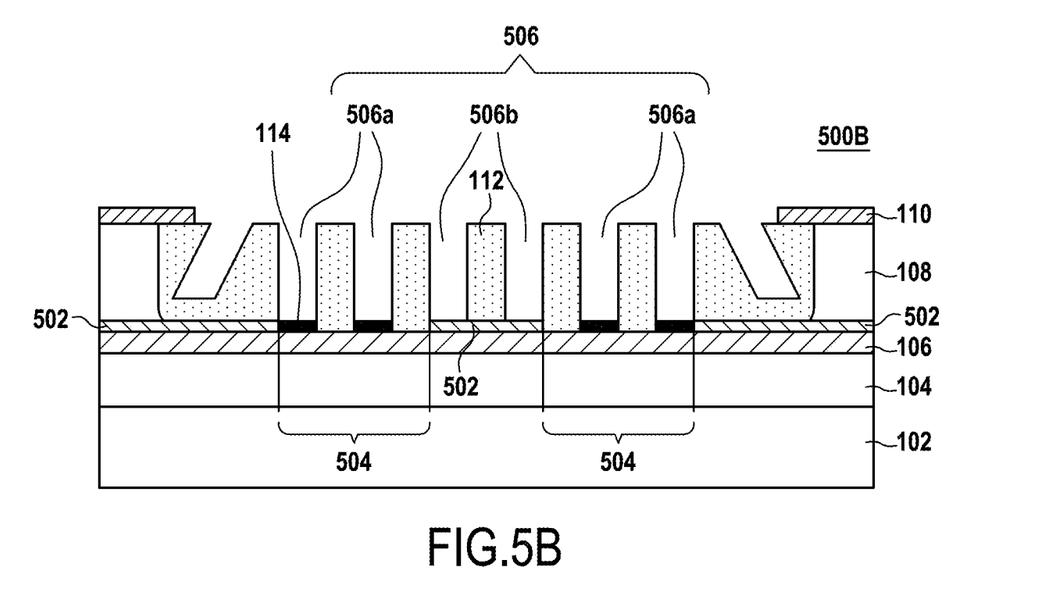

FIGS. 5A-5B illustrate steps of another example process for fabricating an RC device having a capacitive component embedded in an AAO porous region according to an embodiment.

As shown in FIG. 5A, the process begins with a layer stack 500A. The layer stack 500A is similar to the stack 100 described above, namely in that it also comprises a substrate 102, a first metal layer 104, a conductive layer 106, a second metal layer 108, and a mask layer 110. Additionally, however, the layer stack 500A further includes an insulating layer 502 that is deposited and patterned between the conductive layer 106 and the second metal layer 108. As shown, the insulating layer 502 is configured to have an opening onto (above) an area 504 of the conductive layer 506. The insulating layer 502 may be made of silicon oxide, though other materials like aluminum oxide or silicon oxynitride may also be used.

Next, as shown in FIG. 5B, the second metal layer 108 is anodized as described above with reference to FIG. 2A. The resulting porous structure 112 has a plurality of pores 506. In particular, of the plurality of pores 506, the porous structure 112 includes a first set of pores 506a which end at the conductive layer 106 (or, more precisely, which are plugged by oxide plugs 114 of the conductive material) and a second set of pores 506b which end at the insulating layer 502.

Figure 5C:
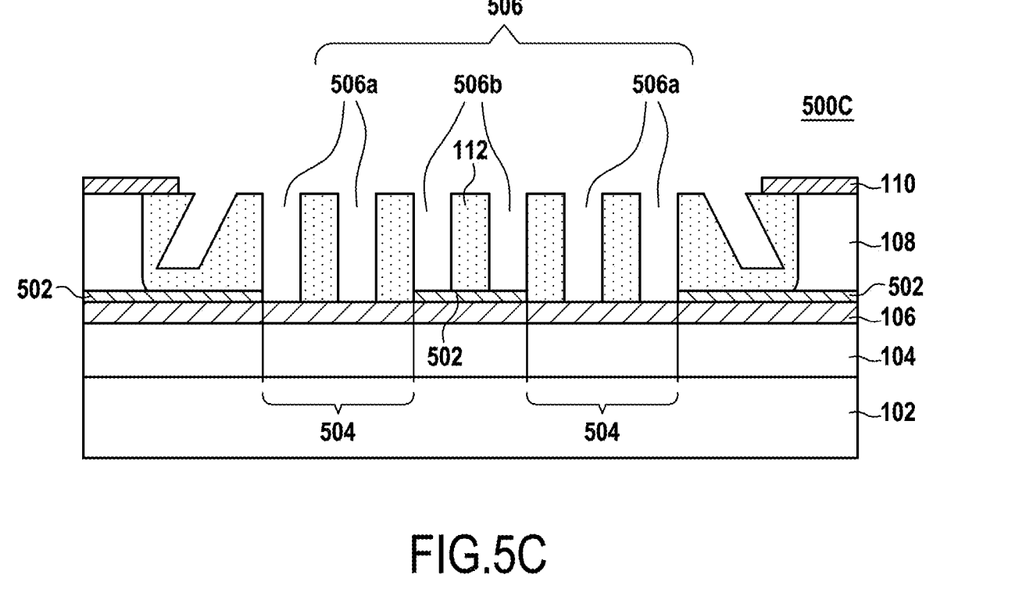

Subsequently, as shown in FIG. 5C, the porous structure 112 is exposed to a wet etching solution as described above with reference to FIG. 2B. The exposure of the porous structure 112 to the wet etching solution causes the oxide plugs 114 to dissolve and opens the bottom ends of the first set of pores 506a onto the (the area 504) conductive layer 504. In contrast, the second set of pores 506b, which terminate at the insulating layer 502, are unaffected by the wet etching.

The resulting structure 500C thus comprises a porous structure 112 having a plurality of pores 506 that extend substantially perpendicularly from a top surface of the porous structure 112 toward the conductive layer 106, and in which only a subset of pores 506a open onto the conductive layer 106.

Figure 5D:
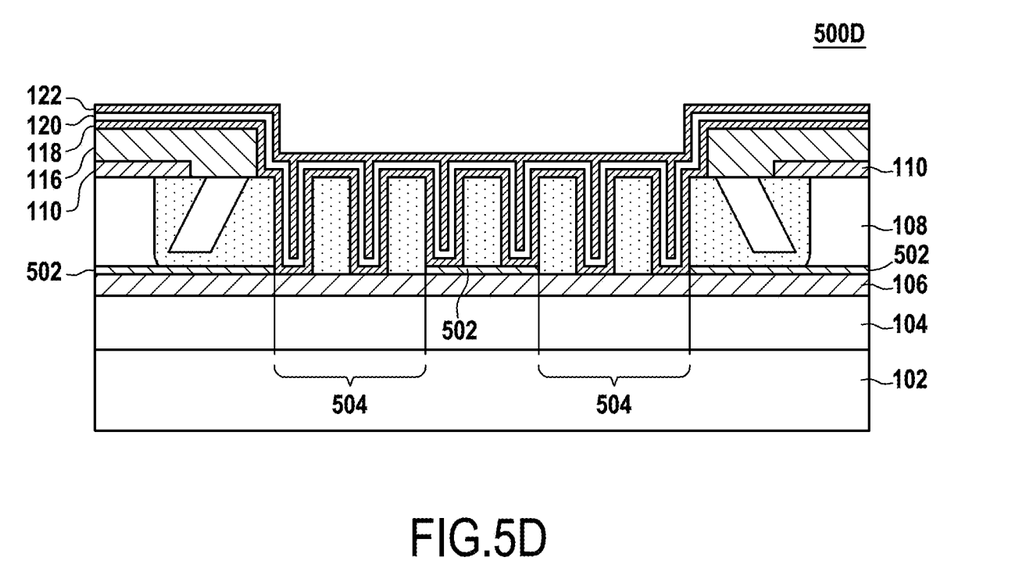

Subsequently, as shown in FIG. 5D, the capacitive component may be embedded within the created porous structure 112 as described above with reference to FIGS. 4D and 4E. In particular, the MIM stack is deposited into the plurality of pores 506 of the porous structure 112. However, while the MIM stack is formed in the plurality of pores 506, the bottom metal layer 118 of the MIM stack contacts the conductive layer 106 only through the first set of pores 506a of the plurality of pores 506.

As such, the resulting structure 500D provides an RC device. The plurality of pores 506, in their entirety, contribute toward the capacitance of the RC device. In contrast, only the second set of pores 506b (of the plurality of pores 506) contribute toward the resistance of the RC device.

In other words, the resistance of the RC device is a function of the size (surface area) of the area 504 of the conductive layer 106 (or alternatively the size of the opening of the insulating layer 502 onto the conductive layer 106). More specifically, the larger the area 504 is (i.e., the greater the contact area between the metal layer 118 and the conductive layer 106), the lower is the resistance of the RC device. Conversely, the smaller the area 504 is (i.e., the smaller the contact area between the metal layer 118 and the conductive layer 106), the higher is the resistance of the RC device.

As such, in accordance with embodiments, the fabrication method may include the steps of selecting a target resistance for the RC device; and determining a surface area of the area 504 of the conductive layer 106 as a function of the target resistance.

Referring back to FIG. 5D, after deposition of the MIM stack, subsequent process steps as described with reference to FIGS. 4F, 4G, and 4H above may then performed to form contacts to the top and bottom terminals of the RC device.

As would be understood by a person of skill in the art based on the teachings herein, the selective contacting approach described in FIGS. 5A-5D may be combined, in an embodiment, with the selective contacting approach described in FIGS. 4A-4H. Particularly, the process would involve the process steps shown in FIGS. 5A and 5B to obtain a structure like structure 500B. Then, the mask layer 110 would be selectively applied on top of the structure 500B as shown in FIG. 4A, and the process would continue as described above with reference to FIGS. 4B-4H.

In such an embodiment, the plurality of pores 412/506 would contribute to the capacitance of the RC device. However, only those pores that fall outside the area 414 of the porous structure 112 and which also end outside the area 504 of the conductive layer 106 would contribute to the resistance of the RC device.

Generally, combining the two approaches provides greater resolution to control the size and/or the shape of the contact area between the metal layer 118 and the conductive layer 106. In one aspect, the combination provides two levers for controlling the size (and the shape) of the contact area (the mask layer 402 and the insulating layer 502). In another aspect, the use of the insulating layer 502 can increase resolution due to the fact that the insulating layer 502 is formed and patterned on a planar layer. As a result, the accuracy of the photolithographic process is greater with respect to the insulating layer 502 than the mask layer 402 (which is formed on top of a 3D structure).

Implementing the insulating layer 502 in RC devices according to embodiments may also be advantageous to further improve the electrical isolation between the bottom metal layer 118 of the MIM stack and the bottom terminal (i.e., metal layer 104). This reduces uncontrolled leakage which can lower the resistance value of the RC device. This is particularly true in the case of large resistance values (e.g., >1 KOhm). Furthermore, as the insulating layer 502 can be made very thin (e.g., between 5-100 nanometers), the profile of the structure, and subsequent process steps, would not be impacted much by the addition of this layer.

According to other embodiments, to reach a particular resistance value, other parameters within the RC device may also be tailored in addition to the selective contacting. For example, the thickness of the AAO porous structure can be increased/decreased to further increase/decrease the resistance. Alternatively or additionally, the top and bottom metal layers 118 and 122 of the MIM can be made thinner/thicker, thereby increasing/decreasing the resistance of individual pores and by consequence total resistance. Generally, significant resistance changes can be made by using these levers with only a small addition to the thickness of the device.

Figure 6:
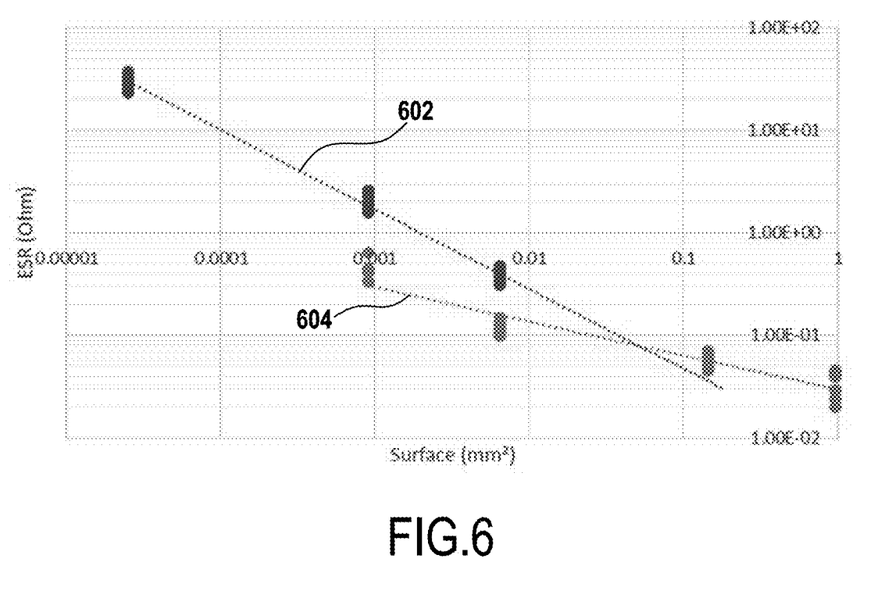
FIG. 6 shows example experimental results illustrating the performance of the disclosed approach to modulate the resistance of the RC device.

FIG. 6 shows example experimental results illustrating the performance of the above described selective contacting approaches to modulate the resistance of an RC device. Particularly, FIG. 6 is a plot of the resistance (ESR) of the RC device as a function of the surface of the open area (i.e., the contact area between the bottom MIM layer 118 and the conductive layer 106). The curve 602 corresponds to a structure with a 10 nm-thick TiN bottom electrode (bottom metal layer of the MIM stack) while the curve 604 corresponds the same structure but with a 15 nm-thick TiN bottom electrode. As shown, in both cases, as the open area increases, the resistance of the RC device decreases. This demonstrates that embodiments of the present invention can be used to selectively adjust the resistance of the RC device by varying the open area surface.

It must be noted that the resistance values obtained in FIG. 6 may not be entirely governed by the open area surface. For example, for very high open area surfaces (e.g., greater than 0.05 mm$^2$), the resulting ESR becomes quite low (e.g., lower than 100 milliOhms) and is controlled not only by the open area but also by the series contribution of the top and bottom terminals. For instance, in the example results of FIG. 6, the structure top and bottom terminals are each made using a 1-unit square of a 3 microns thick Aluminum layer (sheet resistance of 10 milliOhms/square). As such, about 20 milliOhms out of the measured resistance is due to the metallic terminals. However, this contribution due to the terminals becomes negligible for greater ESR values (e.g., greater than 100 milliOhms) which are the values of interest for RC snubber applications.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A method of fabricating an RC device, comprising:
    forming a first metal layer above a substrate;
    forming a conductive layer above the first metal layer;
    forming a second metal layer above the conductive layer;
    forming a first mask layer on top of the second metal layer, the first mask layer having an opening onto the second metal layer;
    anodizing the second metal layer to form a porous structure within the second metal layer, the porous structure underlying the opening of the first mask layer onto the second metal layer and comprising a plurality of pores that extend substantially perpendicularly from a top surface of the porous structure toward the conductive layer;
    forming a second mask layer over the porous structure, the second mask layer having an opening onto a second area of the porous structure;
    etching the bottom ends of a select set of pores of the plurality of pores; and
    forming a metal-insulator-metal (MIM) stack in the plurality of pores of the porous structure.

2. The method of claim 1, wherein the select set of pores correspond to a subset of the plurality of pores of the porous structure.

3. The method of claim 1, wherein said etching opens the select set of pores onto the conductive layer.

4. The method of claim 1, wherein a bottom metal layer of the MIM stack contacts the conductive layer through the select set of pores.

5. The method of claim 1, wherein said etching comprises:
    exposing the porous structure to a wet etching solution.

6. The method of claim 5, wherein prior to said etching, the bottom ends of the select set of pores are plugged up by an oxide of the conductive layer, and wherein exposing the porous structure to the wet etching solution dissolves said oxide.

7. The method of claim 1, wherein the select set of pores are comprised within the second area of the porous structure.

8. The method of claim 1, further comprising:
    forming an insulating layer on top of the conductive layer, the insulating layer having an opening onto a third area of the conductive layer.

9. The method of claim 8, wherein the select set of pores open onto the third area of the conductive layer through the opening of the insulating layer.

10. The method of claim 1, further comprising:
    selecting a target resistance for the RC device; and
    determining a surface area of the second area of the porous structure as a function of the target resistance.

11. The method of claim 8, comprising:
    selecting a target resistance for the RC device; and
    determining a surface area of the third area of the conductive layer as a function of the target resistance.

12. A semiconductor device, comprising:
    a first metal layer disposed over a substrate;
    a conductive layer disposed over the first metal layer; and
    a second metal layer disposed over the conductive layer, the second metal layer embedding a porous structure comprising a plurality of pores that extend substantially perpendicularly from a top surface of the porous structure toward the conductive layer, wherein a first subset of the plurality of pores open onto the conductive layer and a second subset of the plurality of pores are plugged at their bottom ends by an oxide plug of the conductive layer, the oxide plug containing an oxide of the material of the conductive layer, and the oxide plug is not conductive.

13. The semiconductor device of claim 12, further comprising:
    an insulating layer disposed between the conductive layer and the second metal layer, the insulating layer having an opening onto the conductive layer.

14. The semiconductor device of claim 12, comprising:
    a metal-insulator-metal (MIM) stack formed in the plurality of pores of the porous structure, wherein a bottom metal layer of the MIM stack contacts the conductive layer through the subset of open pores.

* * * * *